United States Patent [19]
Fujishiro et al.

[11] Patent Number: 5,294,571
[45] Date of Patent: Mar. 15, 1994

[54] RAPID THERMAL OXIDATION OF SILICON IN AN OZONE AMBIENT

[75] Inventors: Felix Fujishiro; Chang-Ou Lee, both of San Antonio, Tex.; Landon Vines, Boise, Id.

[73] Assignee: VLSI Technology, Inc., San Jose, Calif.

[21] Appl. No.: 918,815

[22] Filed: Jul. 22, 1992

[51] Int. Cl.⁵ .................................... H01L 21/02
[52] U.S. Cl. .................. 437/239; 437/237; 437/243
[58] Field of Search ................ 437/238, 235, 228, 41, 437/225, 231, 968, 983, 985, 237, 236, 239, 243

[56] References Cited

U.S. PATENT DOCUMENTS

| | | | |
|---|---|---|---|
| 4,176,206 | 11/1979 | Inoue | 437/237 |
| 4,916,091 | 4/1990 | Freeman et al. | 437/238 |
| 4,960,726 | 10/1990 | Lechaton et al. | 437/59 |
| 5,028,560 | 7/1991 | Tsukamoto et al. | 437/239 |
| 5,051,380 | 9/1991 | Maeda et al. | 437/238 |
| 5,069,747 | 12/1991 | Cathey et al. | 156/643 |

OTHER PUBLICATIONS

Chao et al., J. Electrochem. Soc., vol. 136, No. 9, pp. 2751-2752 (1989).
Paz de Araujo et al., Electrochem. Soc., vol. 136, No. 9, pp. 2673-2676 (1989).
Nayar et al., Chemtronics, vol. 4, pp. 101-103 (1989).
Pas de Araujo et al., J. Electrochem. Soc., vol. 136, No. 79, pp. 2035-2038 (1989).
Hodul et al., Nuclear Instruments and Methods in Physics Research, pp. 818-822 (1988).
Wolf and Tauber, "Silicon Processing for the VLSI Era", vol. 1, pp. 57-58, Lattice Press, Sunset Beach, Calif. (1990).

Primary Examiner—Olik Chaudhuri
Assistant Examiner—H. Jey Tsai
Attorney, Agent, or Firm—Burns, Doane, Swecker & Mathis

[57] ABSTRACT

Disclosed are methods for preparing $SiO_2$ layers in semiconductor devices by the rapid thermal oxidation of silicon in an ozone ambient.

17 Claims, 1 Drawing Sheet

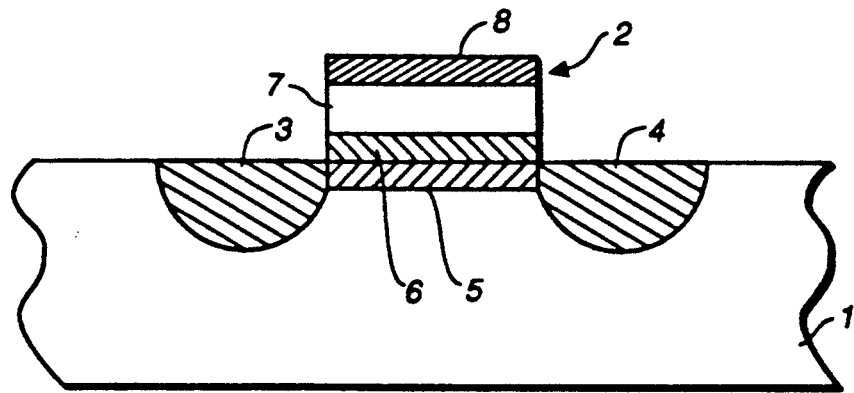
FIG._1
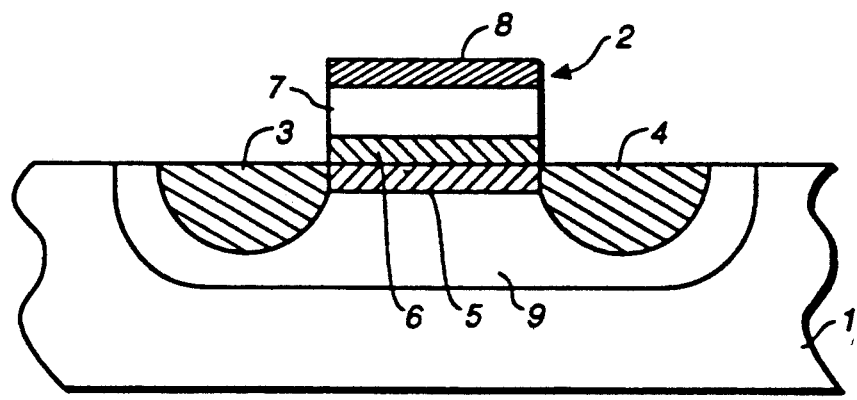
FIG._2

RAPID THERMAL OXIDATION OF SILICON IN AN OZONE AMBIENT

BACKGROUND OF THE INVENTION

1. Field of the Invention

The present invention is directed to methods for preparing $SiO_2$ layers in semiconductor devices by the rapid thermal oxidation of silicon in an ozone ambient.

2. State of the Art

Integrated circuit fabrication requires the formation of numerous circuit elements (e.g., transistors such as MOS transistors in very large scale integration devices) on the surface of a silicon substrate and subsequent connection of some of these elements. Such fabrication requires the formation of numerous $SiO_2$ layers in semiconductor devices, including formation of $SiO_2$ gate oxide layers, $SiO_2$ dielectric (insulating) layers, etc.

For example and as shown in FIGS. 1 and 2, transistor elements, such as transistor element 2, are found on surface of substrate 1. Substrate 1 is part of a silicon wafer which has been processed by conventional techniques to produce a plurality of individual dies or chips. In general, the entire wafer will be subject to the processing steps which are described hereinafter. The drawing, however, illustrates only a small portion of the wafer substrate.

Further in this regard, transistor element 2 generally contains a source site 3 and a reciprocal drain site 4 which are connected by channel 5. In some cases, as shown by FIG. 2, the transistor element 2 is contained within a well region 9. The latter situation is well-known in the art for CMOS transistor fabrication. The substrate I, source site 3, drain site 4, channel 5, and well region 9 are typically doped with Group III element(s) (P-type) such as boron or with Group V element(s) (N-type) such as phosphorus, arsenic, antimony, and the like. Typically, the dopants for substrate 1 (or well region 9, if employed) are different in type as compared to that for source site 3 and drain site 4 (e.g., if substrate 1 employs a P-type dopant, then source site 3 and drain site 4 will use an N-type dopant). The dopant in the source 3 and drain 4 sites serves, in part, to electrically isolate the source 3 and drain 4 sites from the substrate 1 (or well region 9, if employed); and to provide an electrically conductive path to the channel region 5. The dopant in the channel 5 is chosen, in part, to determine the desired voltage threshold (i.e., turn-on or turn-off voltage) of the transistor 2.

In transistor element 2, silicon dioxide ($SiO_2$) layer 6 is deposited or grown on the surface of substrate 1 over channel 5, or the region which will become channel 5. $SiO_2$ layer 6 serves as a "gate oxide" to electrically isolate the gate 7 from the channel 5. One method for forming $SiO_2$ layer 6 onto substrate 1 is by the furnace oxidation of silicon in either a oxygen or ozone ambient at high temperatures (i.e., $>800°$ C.). However, when silicon is heated to a high temperature for extended periods of times, dopants in the silicon can migrate and create problems in the fabrication of active devices.

Specifically, in very large scale integration ("VLSI") and other semiconductor devices, the regions of dopant in silicon wafer are precisely controlled. Thermal treatments, however, can cause the dopants to diffuse and thereby reduce the control of their concentration and locations. For devices fabricated with feature sizes below about 2.0 $\mu$m (e.g., in a 0.25-2.0 $\mu$m range), dopant diffusion (both vertically and horizontally) must be reduced to maintain shallow junctions, controlled gate lengths, etc. Contrarily, when $SiO_2$ layer 6 is formed by thermal (furnace) oxidation, dopant diffusion in channel 5 is difficult to control because the large thermal mass of the susceptors, wafer boats, and reactor walls in the furnace requires that such oxidation be conducted at elevated temperatures for extended periods of time. Similarly, if dopants are introduced to form source site 3 and its reciprocal drain site prior to the formation of $SiO_2$ layer 6, dopant diffusion of the source 3 and drain 4 sites is also difficult to control during such thermal oxidation.

In view of the above, the maximum acceptable amount of dopant diffusion in the device during oxidation of the silicon to silicon oxide is often referred to as a "thermal budget" which amount is both temperature and time dependent. Specifically, at a given temperature, there is a maximum time (or the maximum temperature for a given time) permitted to form a $SiO_2$ layer 6 to a required depth and within permissible levels of dopant migration. As this temperature is lowered, the oxidation can proceed for a longer period of time without exceeding the maximum acceptable amount of dopant diffusion.

With all other factors being equal, the specific thermal budget which can be employed is a variable which is directly related to the amount of dopant migration which can be tolerated in a given semiconductor process technology. In turn, the level of tolerable dopant migration depends, in part, on the short channel transistor performance. Specifically, short channel transistor performance characteristics are negatively impacted when dopant migration exceeds defined levels.

In order to reduce thermal budget and, accordingly, minimize loss of short channel transistor performance, rapid thermal oxidation ("RTO") in an oxygen ambient has been employed. While this procedure results in a significant reductions in thermal budget as compared to furnace oxidation, the continued decrease in feature sizes associated with an increase in the number of circuit elements per chip requires an even lower thermal budget.

SUMMARY OF THE INVENTION

The present invention is directed to the discovery that rapid thermal oxidation of silicon in an ozone ambient reduces the thermal budget necessary to form a defined film of $SiO_2$ on the wafer as compared to rapid thermal oxidation of silicon in an oxygen ambient. Accordingly, at similar oxidation times, a desired thickness of silicon dioxide ($SiO_2$) on the surface of the substrate can be formed at lower temperatures by rapid thermal oxidation in an ozone ambient as compared to use of an oxygen ambient. Conversely, at similar oxidation temperatures, a desired thickness of $SiO_2$ on the surface of the substrate can be formed in a shorter time period by rapid thermal oxidation in an ozone ambient as compared to use of an oxygen ambient.

The reduction in thermal budget results in reduced dopant diffusion from those parts of the silicon wafer containing dopants (e.g., channels, and optionally source sites, drain sites, etc.). Moreover, rapid thermal oxidation of silicon in an ozone ambient provides for higher quality $SiO_2$ as opposed to that prepared by rapid thermal oxidation in an oxygen ambient.

Accordingly, in one of its method aspects, the present invention is directed to a method for preparing a $SiO_2$ layer on a semiconductor device which method comprises the steps of:

(a) placing a semiconductor device, having a surface layer containing silicon in at least a portion thereof, into a chamber; and (b) oxidizing the silicon on the surface of the device to $SiO_2$ by rapid thermal oxidation under conditions wherein at least a portion of the surface of the semiconductor device is oxidized to $SiO_2$ wherein the oxidation is conducted in an atmosphere comprising oxygen and from about 4 to about 15 volume percent ozone at a temperature of at least about 850° C.

In another of its method aspects, the present invention is directed to a method for preparing a $SiO_2$ gate oxide layer on a semiconductor device containing channels, and optionally doped source and drain sites, which method comprises the steps of:

(a) placing the semiconductor device into a chamber of a rapid thermal processing device;

(b) oxidizing the silicon on the surface of the device to $SiO_2$ by rapid thermal oxidation under conditions so as to form a layer of at least 50 Å of $SiO_2$ on the surface of the substrate, wherein the oxidation is conducted in an atmosphere comprising oxygen and from about 4 to about 15 volume percent ozone at a temperature of at least about 850° C.

Preferably, in this embodiment, the source sites, drain sites, channels, substrates, and well regions (if used) contain Group III or Group V dopant elements. More preferably, the source sites and drain sites contain dopants from a similar Group (e.g., Group III) and the substrate (or well region, if used) contains dopants from the other Group (e.g., Group V).

In another preferred embodiment, the oxidation is conducted at a temperature of from about 850° C. to about 1050° C. More preferably, the oxidation is conducted from about 850° C. to about 950° C. and most preferably at about 900° C.

The oxidation times are generally in the order of about 20 to about 60 seconds.

In one of its composition aspects, the present invention is directed to the devices prepared by the methods of this invention.

BRIEF DESCRIPTION OF THE DRAWING

The present invention can be further understood with reference to the following description in conjunction with the appended drawing which illustrates a portion of a semiconductor device containing a transistor element.

Specifically, FIG. 1 illustrates a cross-sectional view of a partially fabricated transistor element on a surface of a silicon substrate of a semiconductor device.

FIG. 2 illustrates a cross-sectional view of a partially fabricated transistor element on a surface of a silicon substrate of a semiconductor device wherein the silicon substrate contains a well region.

DETAILED DESCRIPTION OF THE PREFERRED EMBODIMENT

The present invention is directed, in part, to the discovery that high quality $SiO_2$ layers can be formed on semiconductor devices by use of rapid thermal oxidation of silicon in an ozone ambient.

The present invention is further directed, in part, to the discovery that the thermal budget permitted to achieve a specified degree of oxidation of silicon to $SiO_2$ on the surface of a semiconductor device by rapid thermal oxidation (RTO) can be significantly reduced while improving the quality of $SiO_2$ formed by use of an ozone ambient during oxidation as compared to use of an oxygen ambient. Reductions in thermal budget are particularly important in the formation of $SiO_2$ gate oxides because it reduces both dopant diffusion and the corresponding loss in short channel transistor performance.

Definitions

As used herein, the following terms have the definitions given below. If not defined, terms used herein will have their accepted meanings.

The term "thermal budget" refers to the maximum acceptable diffusion of dopant in a semiconductor device containing doped regions (i.e., source sites, drain sites, channels, etc.). While the thermal budget is arbitrarily set, it is dependent on both time and temperature. Thus, for a given temperature, there is a maximum time permitted for the formation of a $SiO_2$ layer on the surface of semiconductor device within the set thermal budget. As the temperature is reduced, the permitted amount of time is increased.

The term "gate oxide" refers to a layer of dielectric, generally $SiO_2$, formed over the channels in the transistor elements in a semiconductor device to electrically isolate the gate electrode from the channel region and to help set, in part, the threshold voltage of the transistor.

The term "threshold voltage" refers to the minimum voltage required to permit current flow between the source and reciprocal drain sites of the transistor.

The term "rapid thermal oxidation" refers to oxidations employing rapid thermal processing devices. Rapid thermal processing devices employ large-area incoherent energy sources which permit very rapid and uniform heating and cooling. In contrast, in conventional thermal or furnace devices, the large thermal mass of the susceptors, wafer boats, and reactor walls in the furnace requires that oxidation in these devices be conducted at elevated temperatures and extended times.

In rapid thermal oxidation, oxygen is conventionally added to the processing chamber (containing the wafers) and the temperature of the wafer is rapidly but uniformly heated to effect oxidation. In this regard, Paz de Araujo et al, J. Electrochem. Soc., Vol. 136, No. 9, pp. 2673-2676 (1989), recite that the oxidation mechanism for conventional thermal (or furnace) oxidation differs from that for rapid thermal oxidation.

The wafers in rapid thermal processing devices are thermally isolated, so that radiant (not conductive) heating and cooling dominate. Various heat sources are utilized, including arc lamps, tungsten halogen lamps, and resistively-heated slotted graphite sheets.

Suitable rapid thermal processing devices are commercially available from AG Associates, 1325 Borregas Avenue, Sunnyvale, Calif., under the HEATPULSE series (e.g., HEATPULSE 4108, HEATPULSE 4100, HEATPULSE 410/610, HEATPULSE Mini-Pulse, each of which can include a TRAC Subsystem).

Methodology

As noted above, the present invention effects silicon oxidation by rapid thermal processing devices using an ozone ambient. Rapid thermal processing devices and their methods of operation are known in the art and are described, for example, by Wolf and Tauber, "Silicon Processing for the VLSI Era", Vol. 1, pp. 57–58, Lattice press, Sunset Beach, Calif.; and by Hodul et al., Seventh International Conference on Ion Implantation Technology, Kyoto, Japan, pp. 818–822, (1988). The disclosures of these references are incorporated herein by reference.

In the present invention, the to-be-processed semiconductor devices (i.e., wafers) are thermally isolated and added to the processing chamber of the rapid thermal processing devices. An ozone ambient is introduced into the chamber and the rapid thermal processing device is then activated to effect oxidation.

The ozone ambient employed comprises an oxygen stream containing from about 4 to about 15 volume percent ozone. Preferably, the oxygen stream contains from about 4 to about 8 volume percent ozone, more preferably from about 4 to about 6 volume percent ozone, and most preferably about 5 to about 6 volume percent ozone. The ozone ambient can additionally contain small amounts of one or more other materials known in the art to enhance the rate of silicon oxidation. Such materials include, by way of example, chlorine (e.g., HCl), water, etc. If employed, such materials are generally employed at their conventional amounts (e.g., when HCl is employed, it is generally employed up to about 2.5 volume percent HCl).

The ozone ambient is generated by irradiating an oxygen stream with UV light at appropriate wavelengths. See, for example, Chao et al., J. Electrochem. Soc., Vol. 136, No. 9, pp. 2751–2752 (1989). This reference is incorporated herein by reference. Preferably, the ozone ambient is generated in an ozone generator which is separate and apart from the reaction chamber of the rapid thermal processing device and the ozone ambient. Suitable ozone generators are commercially available (e.g., SOG-2 ozone generator from UVP Inc., San Gabriel, Calif.). In this preferred embodiment, the generated ozone ambient is then fed into the rapid thermal processing device to effect silicon oxidation.

Oxidation is effected by heating the wafer in the rapid thermal processing device to a temperature of generally from about 850° C. to about 1050° C.; preferably, from about 850° C. to about 950° C.; and most preferably, at about 900° C. The wafer is maintained at the selected temperature for a period of at least about 20 seconds so as to form a SiO$_2$ layer on the surface of the wafer. When the oxidative process is employed to form a SiO$_2$ gate oxide layer, the wafer is maintained at the selected temperature for a period of from about 20 to about 60 seconds so as to form a SiO$_2$ layer on the surface of the wafer of at least about 50 Å and preferably from about 80 Å to about 150 Å.

The above process can be employed to grow high-quality SiO$_2$ films on silicon, polysilicon, silicide (MoSi$_x$, TiSi$_x$, WSi$_x$, CoSi$_x$, TaSi$_x$, etc.), self-aligned silicide (salicide) (TiSi$_x$, CoSi$_x$, etc.), and other silicon-containing surfaces. The so generated SiO$_2$ films can be used as MOS transistor gate dielectrics, planar or trench capacitor dielectrics, implant or diffusion masking layers, etch-stop layers, isolation between active regions or films, sacrificial layers, and surface passivation layers. The use of the ozone ambient improves the SiO$_2$ quality because the composition will be more uniformly SiO$_2$ and further because the thickness uniformity will be enhanced.

When used in the formation of SiO$_2$ MOS transistor gate dielectrics, the use of an ozone ambient also improves the thermal budget for the formation of the SiO$_2$ gate oxide layer by up to 15% or more. Accordingly, in the process of this invention, there is less diffusion of the dopants from the source sites, the drain sites, and/or the channels as compared to the level of diffusion resulting from rapid thermal oxidation in an oxygen ambient.

In MOS transistor gate formation, a thick layer of SiO$_2$ covers the surface of the wafer in all regions except above the channels. This SiO$_2$ layer has a thickness of generally from about 3000 to about 8000 Å and preferably about 5000 Å. This SiO$_2$ layer is sufficiently thick that migration of oxygen or ozone through the layer is prevented during rapid thermal oxidation. Thus, when the wafer is added to the chamber of the rapid thermal processing device and an ozone ambient is introduced under oxidizing conditions, only the exposed silicon layers (i.e., the channel layers) will be oxidized.

Without being limited by any theory, we believe that the enhancements in the SiO$_2$ quality and thickness uniformity and the reductions in thermal budget are achieved because of the fact that ozone is a more reactive oxidant than oxygen. It is also contemplated that during ozone generation, free radicals and other activated species may be formed which are also more reactive oxidants than oxygen and these assist in the oxidation of silicon.

Figures

FIGS. 1 and 2 illustrate transistor elements, such as transistor element 2, on the surface of substrate 1. Substrate 1 is part of a silicon wafer which has been processed by conventional techniques to produce a plurality of individual dies or chips. In general, the entire wafer will be subject to the processing steps which are described hereinafter. The drawing, however, illustrates only a small portion of the wafer substrate.

Further in this regard, transistor element 2 generally contains a source site 3 and a reciprocal drain site 4 which are connected by channel 5, and in some cases, as shown by FIG. 2, well region 9. Each region is typically doped with Group III element(s) (P-type) such as boron or with Group V element(s) (N-type) such as phosphorus, arsenic, antimony, and the like. Typically, the dopant for substrate 1 (or well region 9, if employed) is different in type as compared to that for source site 3 and drain site 4 (e.g., if substrate 1 employs a P-type dopant, then source site 3 and drain site 4 will use an N-type dopant). The dopant for channel 5 is chosen, in part, to establish the desired voltage threshold of the transistor element 2. The dopant in the source 3 and drain 4 sites serves, in part, to electrically isolate the source 3 and drain 4 from the substrate 1 (or well region 9, if employed) and to provide an electrically conductive path to channel 5.

In transistor element 2, SiO$_2$ layer 6 is deposited or grown on the surface of substrate 1 over channel 5. SiO$_2$ layer 6 serves as a "gate oxide" to electrically isolate the gate 7 from the channel 5, and to establish, in part, the voltage threshold of the transistor element 2. The SiO$_2$ gate oxide layer is formed in the manner of this invention and has a thickness of at least about 50 Å and preferably from about 80 to about 150 Å.

After formation of the gate oxide layer 6, a layer of polysilicon forms gate 7 over gate oxide layer 6 and then a layer of silicide 8 (e.g., MoSi, TiSi, WSi, TaSi, CoSi, etc.) is optionally placed over gate 7 to complete the transistor element 2. FIGS. 1 and 2 depict the case where silicide layer 8 is formed or deposited over gate 7.

The following example is offered to illustrate the present invention and should not be construed in any way as limiting its scope.

EXAMPLE

A silicon wafer having a source sites, drain sites, and channels formed on the surface thereof is cleaned using deionized water (5 minutes), $H_2SO_4:H_2O_2$ (2:1) for 5 minutes, deionized water (10 minutes), $H_2O:HF$ (10:1) for 30 seconds, deionized water (10 minutes) and finally is spin-dried. The silicon wafer contains a layer of $SiO_2$ of about 6000 Å over its entire surface except for the channel surface areas which are comprised of silicon.

The wafer is thermally insulated and is then placed into the chamber of a HEATPULSE 410/610 rapid thermal processing device (AG Associates, Sunnyvale, Calif.). An oxygen stream is fed to an ozone generator (e.g., SOG-2 ozone generator from UVP Incorporated, San Gabriel, Calif.) which generates ozone by passing oxygen through a quartz tube exposed to a UV light source capable of emitting suitable UV light (e.g., 185 and 245 nm spectral lines). The length of time the oxygen is exposed to the UV light is sufficient to provide an ozone ambient of at least 4 volume percent. The ozone ambient is then passed into the rapid thermal processing device.

The wafer in the chamber of the rapid thermal processing device is then heated to a temperature of about 900° C. and then maintained at this temperature for about 30 seconds. Afterwards, the wafer is cooled to provide for a silicon dioxide layer of about 80-100 Å thick on the channel surface areas of the wafer.

What is claimed is:

1. A method for preparing a $SiO_2$ layer on a semiconductor device which method comprises the steps of:
   (a) placing a semiconductor device having a surface layer containing silicon in at least a part thereof, into a chamber; and
   (b) oxidizing the silicon on the surface of the device to $SiO_2$ by rapid thermal oxidation under conditions wherein at least a portion of surface of the semiconductor device is oxidized to $SiO_2$ wherein the oxidation is conducted in an atmosphere comprising oxygen and form about 4 to about 15 volume percent ozone at a temperature from about 850° C. to about 1050° C.

2. A method for preparing a $SiO_2$ gate oxide layer on a semiconductor device containing a substrate, channels, and optionally, doped source and drain sites, which method comprises the steps of:
   (a) placing the semiconductor device into a chamber of a rapid thermal processing device;
   (b) oxidizing the silicon on the surface of the device to $SiO_2$ by rapid thermal oxidation under conditions so as to from a layer of at least 50 Å of $SiO_2$ on the surface of the substrate, wherein the oxidation is conducted in an atmosphere comprising oxygen and from about 4 to about 15 volume percent ozone at a temperature from about 850° C. to about 1050° C.

3. The method as described in claim 2 wherein the source sites, drain sites, channels, and substrate contain Group III or Group V dopant elements.

4. The method as described in claim 3 wherein the substrate contains well regions.

5. The method as described in claim 3 wherein the source sites and drain sites contain one or more dopants from Group III elements and the channel contains one or more dopants from Group V or III, and the substrate contains one or more dopants from Group V.

6. The method as described in claim 3 wherein the source sites and drain sites contain one or more dopants from Group V elements and the channel contains one or more dopants from Group V or III, and the substrate contains one or more dopants from Group III.

7. The method as described in claim 4 wherein the source sites and drain sites contain one or more dopants from Group III elements and the channel contains one or more dopants from Group V or III, and the well region of the substrate contains one or more dopants from Group V.

8. The method as described in claim 4 wherein the source sites and drain sites contain one or more dopants from Group V elements and the channel contains one or more dopants from Group V or III, and the well region of the substrate contains one or more dopants from Group III.

9. The method as described in claim 2 wherein the oxidation is conducted at a temperature of from about 850° C. to about 1050° C.

10. The method as described in claim 9 wherein the oxidation is conducted from about 850° C. to about 950° C.

11. The method as described in claim 10 wherein the oxidation is conducted at about 900° C.

12. The method as described in claim 2 wherein the $SiO_2$ layer is from about 80 to about 150 Å.

13. The method as described in claim 2 wherein the oxidation times are from about 20 to about 60 seconds.

14. The method as described in claim 1 wherein the ozone ambient contains from about 5 to about 6 volume percent ozone.

15. The method as described in claim 1 wherein the ozone ambient further comprises up to about 2.5 volume percent of HCl.

16. The method as described in claim 2 wherein the ozone ambient contains from about 5 to about 6 volume percent ozone.

17. The method as described in claim 2 wherein the ozone ambient further comprises up to about 2.5 volume percent of HCl.

* * * * *